(12) United States Patent
Aksu et al.

(10) Patent No.: US 10,000,860 B1
(45) Date of Patent: Jun. 19, 2018

(54) METHODS OF ELECTROCHEMICAL DEPOSITION FOR VOID-FREE GAP FILL

(71) Applicant: APPLIED Materials, Inc., Santa Clara, CA (US)

(72) Inventors: Serdar Aksu, Santa Clara, CA (US);
Jung Gu Lee, Santa Clara, CA (US);
Bart Sakry, Santa Clara, CA (US);
Roey Shaviv, Santa Clara, CA (US)

(73) Assignee: APPLIED Materials, Inc., Santa Clara, CA (US)

( * ) Notice: Subject to any disclaimer, the term of this patent is extended or adjusted under 35 U.S.C. 154(b) by 0 days. days.

(21) Appl. No.: 15/380,771

(22) Filed: Dec. 15, 2016

(51) Int. Cl.
| | | |
|---|---|---|
| *C25D 5/18* | (2006.01) | |
| *C25D 3/38* | (2006.01) | |
| *C25D 7/12* | (2006.01) | |
| *C25D 5/34* | (2006.01) | |
| *C25D 5/16* | (2006.01) | |
| *C25D 17/00* | (2006.01) | |

(52) U.S. Cl.
CPC ............ *C25D 5/18* (2013.01); *C25D 3/38* (2013.01); *C25D 5/16* (2013.01); *C25D 5/34* (2013.01); *C25D 7/12* (2013.01); *C25D 17/001* (2013.01)

(58) Field of Classification Search
CPC .......... C25D 17/001; C25D 5/16; C25D 5/18; C25D 5/34; C25D 3/38–3/40

USPC ............................................... 205/157, 104
See application file for complete search history.

(56) References Cited

U.S. PATENT DOCUMENTS

| | | | | |
|---|---|---|---|---|
| 8,268,155 | B1* | 9/2012 | Zhou ................ | C25D 3/38 205/123 |
| 2005/0095854 | A1* | 5/2005 | Uzoh ................ | H01L 21/2885 438/678 |
| 2005/0274622 | A1* | 12/2005 | Sun ................ | C25D 3/38 205/209 |
| 2010/0300888 | A1* | 12/2010 | Ponnuswamy ...... | C25D 3/38 205/157 |
| 2014/0174938 | A1* | 6/2014 | Schieffer .......... | C25D 5/18 205/108 |

* cited by examiner

*Primary Examiner* — Brian W Cohen
(74) *Attorney, Agent, or Firm* — Christensen O'Connor Johnson Kindness PLLC

(57) ABSTRACT

A method of electroplating on a workpiece having at least one sub-30 nm feature includes applying a first electrolyte chemistry to the workpiece, the chemistry including a metal cation solute species having a concentration in the range of about 50 mM to about 250 mM and a suppressor resulting in polarization greater than 0.75 V and reaching 0.75 V of polarization at a rate greater than 0.25 V/s, and applying an electric waveform, wherein the electric waveform includes a period of ramping up of current followed by a period of partial ramping down of current.

21 Claims, 11 Drawing Sheets

| Split No | WF/ Split | A (A) | B (ms) | C (A) | D (ms) | E | F (Fill1 I) (A) | Comment |
|---|---|---|---|---|---|---|---|---|
| 1 | WF4 | 9.3 | 100 | 5.6 | 150 | 1 | 2.7 | CKM |
| 2 | WF21 | 9.3 | 500 | 5.6 | 150 | 1 | 2.7 | Longer ramp down time |
| 3 | WF22 | 13.0 | 100 | 5.6 | 150 | 1 | 2.7 | 40% higher peak current |
| 4 | 5200 | | | | Control-BKM | | | Control |

*FIG. 2*

METHODS OF ELECTROCHEMICAL DEPOSITION FOR VOID-FREE GAP FILL

BACKGROUND

An integrated circuit is an interconnected ensemble of devices formed within a semiconductor material and within a dielectric material that overlies a surface of the semiconductor material. Devices that may be formed within the semiconductor include MOS transistors, bipolar transistors, diodes, and diffused resistors. Devices that may be formed within the dielectric include thin film resistors and capacitors. The devices are interconnected by conductor paths formed within the dielectric. Typically, two or more levels of conductor paths, with successive levels separated by a dielectric layer, are employed as interconnections. In current practice, copper and silicon oxide are typically used for, respectively, the conductor and the dielectric.

The deposits in a copper interconnect typically include a dielectric layer, a barrier layer, a seed layer, copper fill, and a copper cap. Conventional electrochemical deposition (ECD) for copper fill and cap is performed in the feature using an acid plating chemistry. Electrochemical deposition of copper has been found to be the most cost effective manner by which to deposit a copper metallization layer. In addition to being economically viable, such deposition techniques provide a substantially bottom up (e.g., non-conformal) copper fill that is mechanically and electrically suitable for interconnect structures.

Conventional ECD copper acid plating chemistry may include, for example, copper sulfate, sulfuric acid, hydrochloric acid, and organic additives (such as accelerators, suppressors, and levelers). The additives drive void-free, bottom-up fill in a feature through their adsorptive and desorptive properties and through competitive reactions, for example, by suppressing plating at the top and on the sidewalls of the feature, while enhancing plating at the bottom of the feature.

The steady downscaling of interconnect features presents new challenges, because the characteristic dimensions (such as feature width and aspect ratio) hinder and alter the reactivity characteristics of additives typically used. In that regard, sub-30 nm features used for copper interconnects have small enough volume and require such few copper atoms that, in a conventional ECD copper acid plating chemistry, the features become filled within the first few seconds of plating. This is a shorter time period than that required for the adsorption and desorption kinetics of the bath additives that drive traditional bottom-up filling.

Therefore, in small features (e.g., sub-30 nm features), a conventional ECD fill may result in a lower quality interconnect due to the presence of voids. As one example of a type of void formed using conventional ECD deposition, the opening of the feature may pinch-off. Many other types of voids can also result from using the conventional ECD copper fill process in a small feature. Such voids and other intrinsic properties of a deposit formed using conventional ECD copper fill can increase the resistance of the interconnect, thereby slowing the device and deteriorating the reliability of the copper interconnect.

Therefore, there exists a need for methods of electrochemical deposition for filling sub-30 nm features from the bottom up, leaving a reduced number of void regions. Embodiments of the present disclosure are directed to filling this and other needs.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

In accordance with one embodiment of the present disclosure, a method of electroplating on a workpiece having at least one sub-30 nm feature is provided. The method includes (a) applying a first electrolyte chemistry to the workpiece, the chemistry including a metal cation solute species having a concentration in the range of about 50 mM to about 250 mM and a suppressor resulting in polarization greater than 0.75 V and reaching 0.75 V of polarization at a rate greater than 0.25 V/s; and (b) applying an electric waveform, wherein the electric waveform includes a period of ramping up of current followed by a period of partial ramping down of current.

In any of the methods or embodiments described herein, the metal cation may be copper.

In any of the methods or embodiments described herein, either or both of the ramping up of current and the ramping down of current may be selected from the group consisting of linear continuous ramping, non-linear continuous ramping, or pulsed ramping.

In any of the methods or embodiments described herein, the period of partial ramping down of current may immediately follow the period of ramping up of current or may be after a hold period following the period of ramping up of current.

In any of the methods or embodiments described herein, the ramping up period may be in the range of about 50 ms to about 200 ms.

In any of the methods or embodiments described herein, the ramping up period may begin either immediately upon entry or after an initial delay.

In any of the methods or embodiments described herein, the ramping up achieves a current level which may be selected from the group consisting of in the range of about 1 amps to about 15 amps and in the range of about 7 amps to about 15 amps.

In any of the methods or embodiments described herein, the partial ramping down period may be for a period in the range of about 50 ms to 5000 ms.

In any of the methods or embodiments described herein, the ramping down may be from the current level achieved by ramping up to a current level in the range of about 2 amps to about 8 amps.

In any of the methods or embodiments described herein, the electric waveform may include a period of ramping up of current immediately followed by a period of partial ramping down of current.

In any of the methods or embodiments described herein, the electric waveform may include a period of ramping up of current immediately followed by an entry hold period of steady state current, immediately followed by a period of partial ramping down of current.

In any of the methods or embodiments described herein, the entry hold period may be for a time period in the range of about 0 to about 200 ms.

In any of the methods or embodiments described herein, a method may further include a ramp down hold period of steady state current immediately following the period of partial ramp down of current and at the current level of the completion of the partial ramp down.

In any of the methods or embodiments described herein, the ramp down hold period of steady state current may be for a period in the range selected from the group consisting of about 0 secs to about 1.0 sec and about greater than 0 secs to about 1.0 sec.

In any of the methods or embodiments described herein, the ramp down hold period of steady state current may be held at a current level in the range of about 2 amps to about 8 amps.

In any of the methods or embodiments described herein, a method may further include a first period of steady state current following the hold period of steady state current to fill one or more features on the workpiece.

In any of the methods or embodiments described herein, the first period of steady state current may be for a period in the range of about 10 secs to about 240 secs.

In any of the methods or embodiments described herein, the first period of steady state current may be held at a current level in the range of about 2 amps to about 8 amps.

In any of the methods or embodiments described herein, a method may further include a second period of steady state current following the first period of steady state current to fill one or more features on the workpiece.

In any of the methods or embodiments described herein, the second period of steady state current may be for a period in the range of about 0 secs to about 240 secs.

In any of the methods or embodiments described herein, the second period of steady state current may be held at a current level in the range of about 4 amps to about 8 amps.

In any of the methods or embodiments described herein, the second period of steady state current may have a current level greater than the first period of steady state current.

In any of the methods or embodiments described herein, a method may further include a capping step for the workpiece.

In any of the methods or embodiments described herein, the current for the capping step may have a current level in the range of 15 amps to about 25 amps.

In any of the methods or embodiments described herein, the workpiece may be rotated during entry at a speed in the range of about 35 to about 175 rpms.

DESCRIPTION OF THE DRAWINGS

The foregoing aspects and many of the attendant advantages of the present disclosure will become more readily appreciated as the same become better understood by reference to the following detailed description, when taken in conjunction with the accompanying drawings, wherein:

FIG. 2 is a table of exemplary data used in the waveform scheme of FIG. 1;

DETAILED DESCRIPTION

Figure 1:
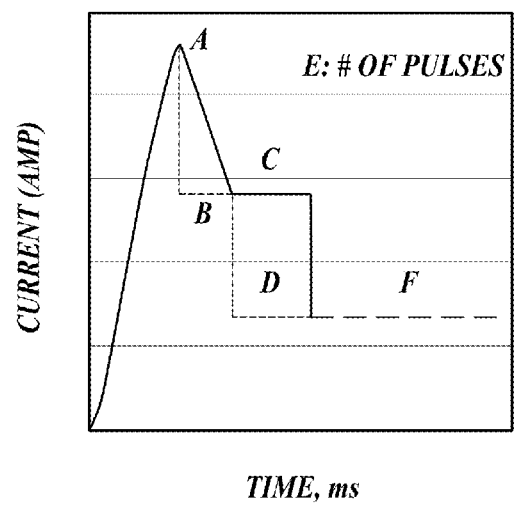
FIG. 1 is a plot of an exemplary waveform scheme for electrochemical deposition processes in accordance with embodiments of the present disclosure.

Embodiments of the present disclosure are directed to methods for electrochemical deposition for metals to achieve void-free, bottom-up fill in small features. In accordance with one embodiment of the present disclosure, a method includes providing a physical driving force to encourage void-free, bottom-up fill in small features. A suitable physical driving force may include applying a unique plating electric waveform at the beginning of the plating process. In addition to the waveform, a plating electrolyte having low copper concentration may help promote void-free, bottom-up fill in small features.

Small features described herein may include sub-30 nm features and sub-20 nm features.

The term "void-free fill" is defined in the art as a feature having a reduced void fill so as not to significantly increase the resistance of the interconnect or significantly affect yield or performance of the interconnect. Although features may include a population of voids, whether generated during plating or during later processing conditions, these voids are generally undetectable in a "void-free fill." In that regard, the voids are undetectable when examined visually, for example, using SEM or TEM images. Moreover, the voids are undetectable if the smaller feature achieves comparable performance values, for example, yield, resistance, and reliability values, when compared to a larger feature that has been determined to be acceptable in the industry for its performance achievements, for example, a 45 nm feature.

Plating Electrolyte

Methods in accordance with embodiments of the present disclosure of electroplating on a workpiece having at least one sub-30 nm feature include applying a first electrolyte chemistry to the workpiece, the chemistry including a metal cation solute species. In one embodiment of the present disclosure, the metal cation is a copper cation.

The electroplating chemistry may be an acid metal damascene plating bath, including, for example, metal ions (such as copper ions in the form of copper sulfate), an acid concentration (such as sulfuric acid), a halide concentration (such as a chloride ion concentration in the form of hydrochloric acid), and organic additives (such as accelerators, suppressors, and levelers). It should be appreciated, however, that the methods described herein may apply to other metals besides copper and other types of chemistries besides those having an acid concentration.

In one embodiment of the present disclosure, copper concentration in the plating electrolyte may be in the range of about 50 mM to about 250 mM. In another embodiment of the present disclosure, copper concentration in the plating electrolyte may be in the range of about 50 mM to about 80 mM (about 3.2 g/L to about 5 g/L). The ranges described herein are dilute copper concentrations, as compared to typical copper concentrations in the range of about 15 g/l to about 60 g/l, with an exemplary concentration of about 40 g/l. In accordance with embodiments of the present disclosure, a lower metal ion concentration helps to slow the kinetics of plating to prevent pinch-off in small features, as described in greater detail below.

In another embodiment of the present disclosure, halide concentration in the plating electrolyte may be at a concentration of about 30 to about 100 ppm. In one non-limiting example, halide concentration may be at a concentration of about 50 ppm (about 1.4 mM Cl). In embodiments of the present disclosure, the halide ion may be selected from the group consisting of chloride, bromide, and iodide ions, and combinations thereof.

In another embodiment of the present disclosure, sulfuric acid concentration in the plating electrolyte may be in the range of about 4 to about 20 g/L. In another embodiment of the present disclosure, sulfuric acid concentration in the plating electrolyte may be in the range of about 5 to about 10 g/L (about 50 to about 100 mM sulfuric acid).

In once embodiment of the present disclosure, the low copper concentration plating electrolyte includes 3.2-15 g/L Cu (50 mM-250 mM), 5-20 g/L acid, and 30 -100 ppm Cl.

Optional organic additives may be present in various concentrations depending on the operational conditions of the plating baths. Because organic additives in conventional ECD copper acid plating chemistry (such as accelerators, suppressors, and levelers) are largely ineffective in plating chemistry for small features in accordance with embodiments of the present disclosure, some or all of these additives may not be needed, and therefore may be removed from the plating bath. However, if larger features are being plated using the same chemistry bath as the smaller features, then these additives can be included in the plating bath to facilitate void-free plating in the larger features.

In accordance with some embodiments of the present disclosure, the plating electrolyte includes strong suppression to better protect the seed layer from corrosion and to prevent pinch-off. As non-limiting examples, the suppressor may be a fast adsorbing, strong suppressor as commercially available, for example, from MacDermid Ethone, such as Next Generation or Next Gen.

A strong suppressor in accordance with embodiments of the present disclosure may be classified as a suppressor resulting in a maximum polarization greater than 0.75 V. And a fast adsorbing suppressor in accordance with embodiments of the present disclosure may be classified as a suppressor reaching maximum polarization at a rate greater than 0.25 V/s. Referring to the illustrated example in FIG. 11, the rate of polarization of Suppressor 1 (which is both a strong and a fast suppressor in accordance with embodiments of the present disclosure) is 0.83/3 V/s=0.28 V/s. The rate of polarization of Suppressor 2 (which is a strong suppressor as well but is slower than Suppressor 1) is 0.84/6 V/s=0.14 V/s. Therefore, the rate of polarization for Suppressor 1 is twice that of Suppressor 2.

Polarization may be dependent on copper concentration in the electrolyte. For example, for 250 mM of copper in the electrolyte, polarization is at about 0.75 V. For 80 mM of copper in the electrolyte, polarization is greater than 0.80 V.

Because the electrolyte includes a dilute copper concentration, the mass transfer rate of copper in each feature on the workpiece is low, and therefore, the deposition rate is slowed down. With the deposition rate slowed down, the suppressor can be adsorbed by the seed layer to protect the thin seed layer in the small feature from being etched by the electrolyte on the sidewalls. As discussed in greater detail below, a waveform can be applied to manipulate the molecules during plating, with the specifics of the waveform depending on the characteristics of the suppressor being used.

The plating bath may also include a leveler compound for low mounding.

Rotation of Workpiece During Entry

The workpiece may be rotated during entry at a speed in the range of about 35 to about 175 rpms. Rotation of the workpiece during entry results in a more efficient wetting and provides the advantageous effect of better gap fill and more uniform plated film.

Waveform

The use of an electric waveform adds a physical component to the chemistry plating bath to slow the kinetics and reduce pinch-off. The waveform adds kinetic energy in locations inside the feature that chemistry alone will not affect. Because the feature size is very small and approximately of the same scale or on the same order as the plating additive molecules, the plating chemistry does not behave as expected based on plating behavior in larger features. Therefore, the use of a waveform physically manipulates the behavior of the molecules during plating. The waveform may be an electric current waveform or an electric potential waveform.

Although not wishing to be bound by theory, the waveform is designed by the inventors to result in slower Cu plating kinetics and faster suppression kinetics in small features to help reduce pinch-off. Moreover, the waveform may decrease the time delays of the effectiveness of additives (such as a suppressor) in a small feature.

The waveform may include ramping up, ramping down, and hold periods. Ramping-up and partial ramping-down of current in the waveform can be used to control current density as surface area changes in the features of the workpiece. For example, as the features fill, surface area is decreasing and corresponding current in the waveform is partially ramped down. As the surface area decreases, lower current to the wafer can be used to maintain the current density level. A hold current period between the ramping up and ramping down periods may be used for nucleation after the workpiece is fully wetted and moving toward deposition.

Referring to FIG. 1, in accordance with one embodiment of the present disclosure, a suitable current waveform includes a period of ramping up of current to point A followed by a period of partial ramping down of current from point A to point B. In some embodiments of the present disclosure, the time period for the waveform is less than one second. In some embodiments, the time period for the waveform is open-ended and can be changed based on the fill-rate changing. Other embodiments of the present disclosure include subsequent steady state current periods, for example, shown as C and F in FIG. 1. Exemplary waveform parameters for values A, B, C, D, E, and F are provided in FIG. 2, as described in more detail in EXAMPLE 1 below.

Figure 3A:
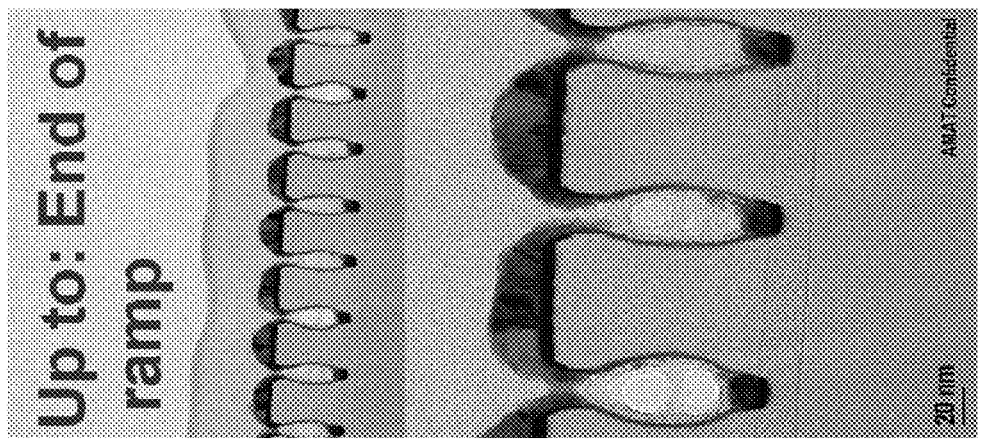
FIGS. 3A-3F include a series of TEM images should the progress of gap fill capability in accordance with embodiments of the present disclosure.
Figure 3B:
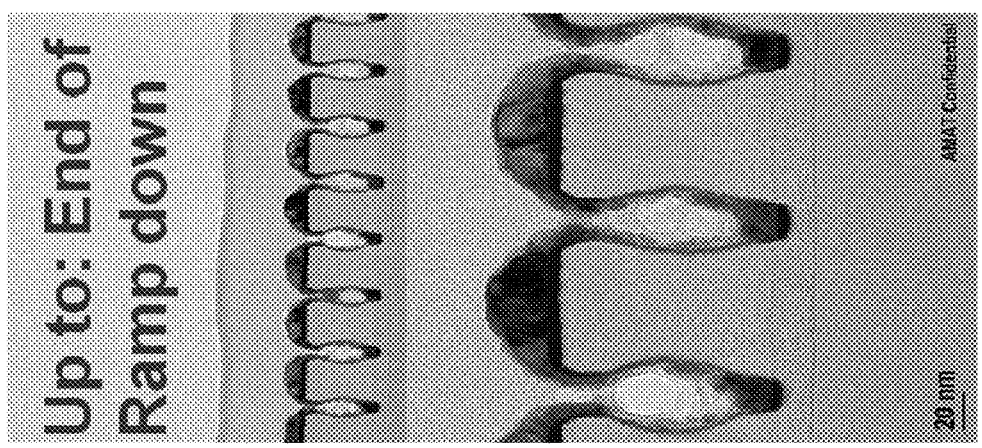
Figure 3C:
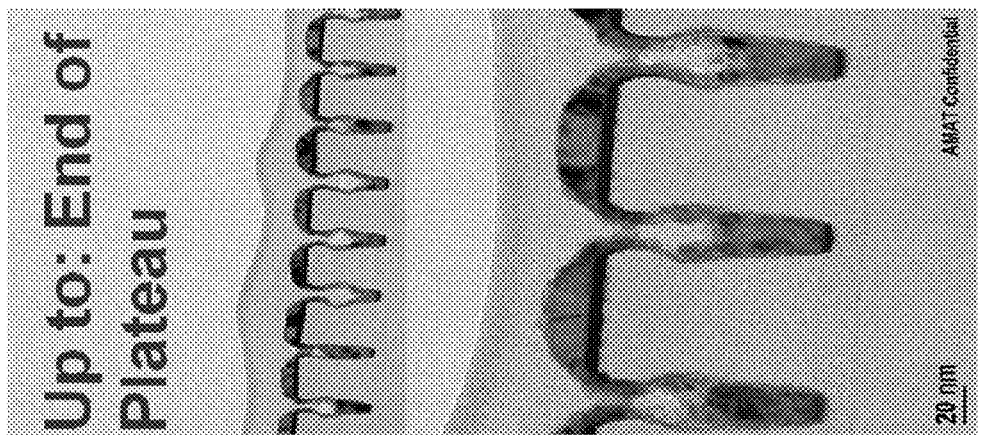
Figure 3F:
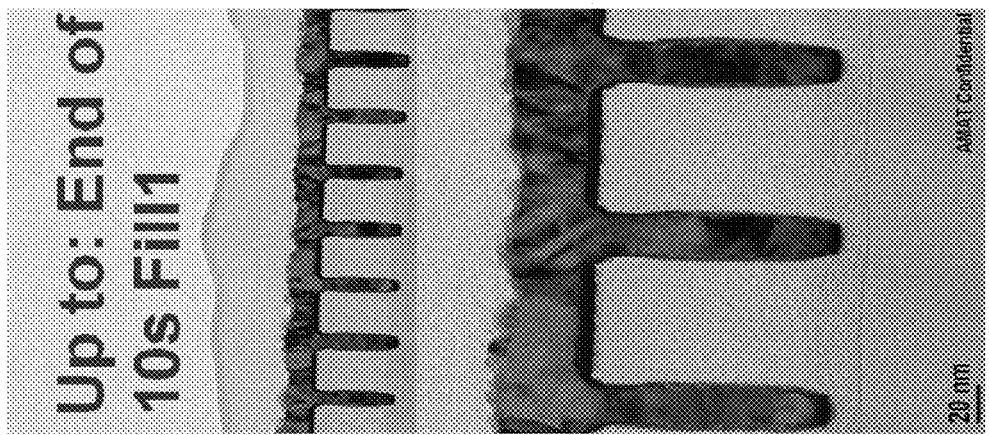
Figure 3E:
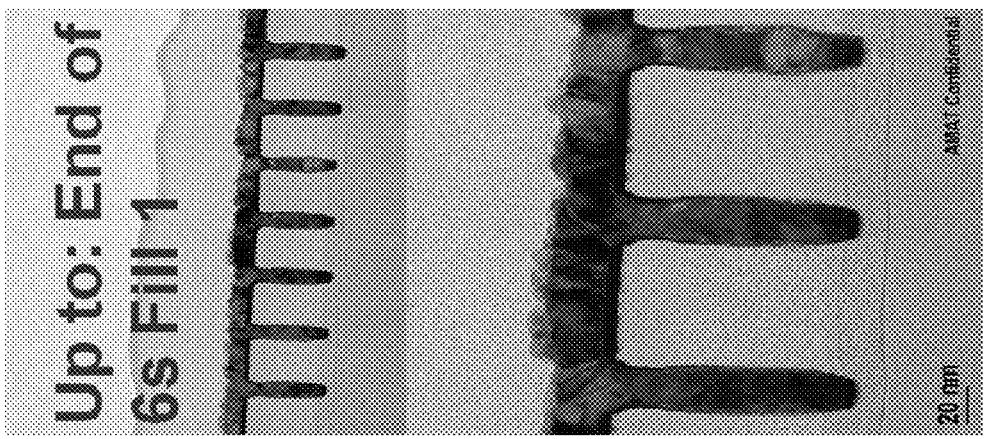
Figure 3D:
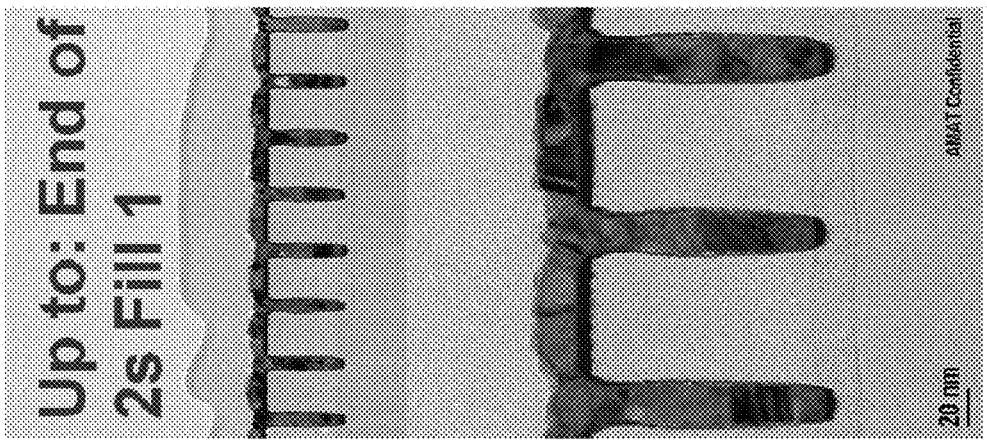
Figure 10:
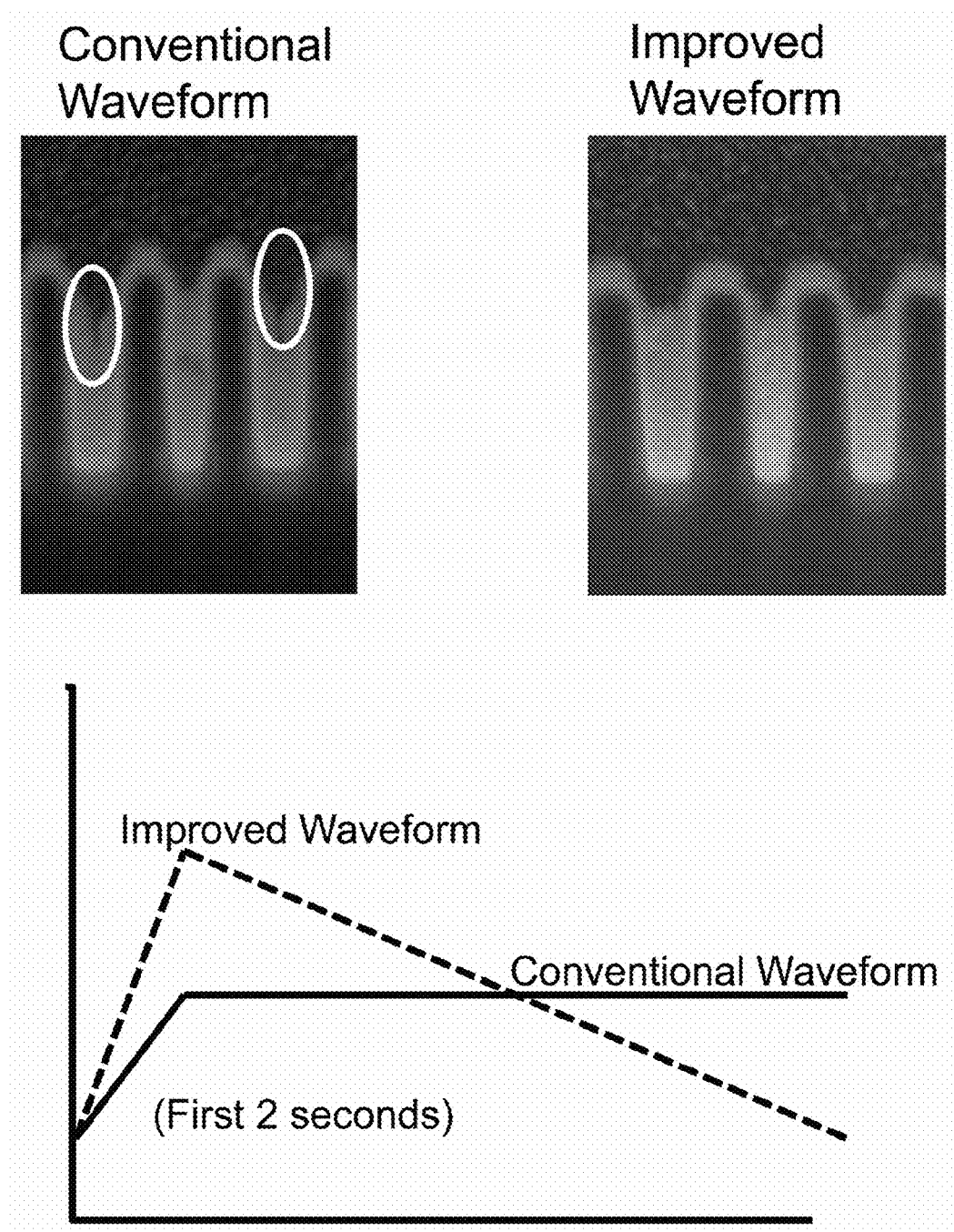
FIG. 10 is a graphical depiction showing changes between the conventional waveform and an improved waveform and corresponding SEM images of resultant plating in the features in accordance with embodiments of the present disclosure.

Referring to FIGS. 3A-3F, exemplary TEM images of partially plated samples are provided to show bottom-up fill developments as a waveform scheme in accordance with one embodiment of the present disclosure progresses, as described in more detail in EXAMPLE 2 below. Referring to FIG. 3A, exemplary deposition at the end of the period of ramping up is provided. Referring to FIG. 3B, exemplary deposition at the end of the period of partial ramping down is provided. Referring to FIG. 3C, exemplary deposition at the end of a steady state current hold period is provided. Referring to FIGS. 3D, 3E, and 3F, exemplary deposition at the end of a two, six, and ten seconds, respectively, of fill is provided. The TEM images show fill without pinch-off and bottom or middle pinholes. (Compare FIG. 10.)

Ramping Up Period

In one embodiment of the present disclosure, a ramping up period begins at entry, for example, from current level of zero to a current level achieved at point A for the time period from zero to point A in FIG. 1. Although shown in FIG. 1 as beginning immediately upon entry, ramping up of current may begin after a period of delay (see for example, delays shown in the waveforms of FIGS. 5 and 6). The length of the delay may vary and may be dependent on when the power supply is triggered.

In one embodiment of the present disclosure, an advanced entry process is used for bubble-free wetting and current and voltage control.

In the triggered hot entry, the current is an open circuit until the wafer touches the chemistry, thereby closing the circuit to initiate the start of the pre-set waveform. Because the entire workpiece is not all wet at once, a ramping of current is used to maintain a constant current density in the workpiece during the wetting stage.

The ramping of the current may be performed in one or more ways. Referring to the non-limiting example in FIG. 1, the ramping is a steady linear ramping. Non-linear ramping may also be within the scope of the present disclosure. As seen in the illustrated embodiment of FIG. 4, the ramping up may be in the form of a non-linear "S" ramp. In one embodiment of the present disclosure, the ramping up period may be in the range of about 50 ms to about 180 ms. In another embodiment of the present disclosure, the ramping up period may be in the range about 50 ms to about 200 ms. In accordance with another embodiment of the present disclosure, the ramping up period is for a period of less than about 0.2 seconds (200 ms).

As a non-limiting example, it takes about 150 ms (from about 0 to about 150 ms) for the entire workpiece to be immersed in the chemistry. Referring to the non-limiting examples in FIGS. 5 and 6, steady ramping occurs after a short delay and then is held constant. The length of the delay may be dependent on when the power supply is triggered. In one embodiment of the present disclosure, the length of the delay may be in the range of about 0 ms to about 2 ms.

Figure 5:
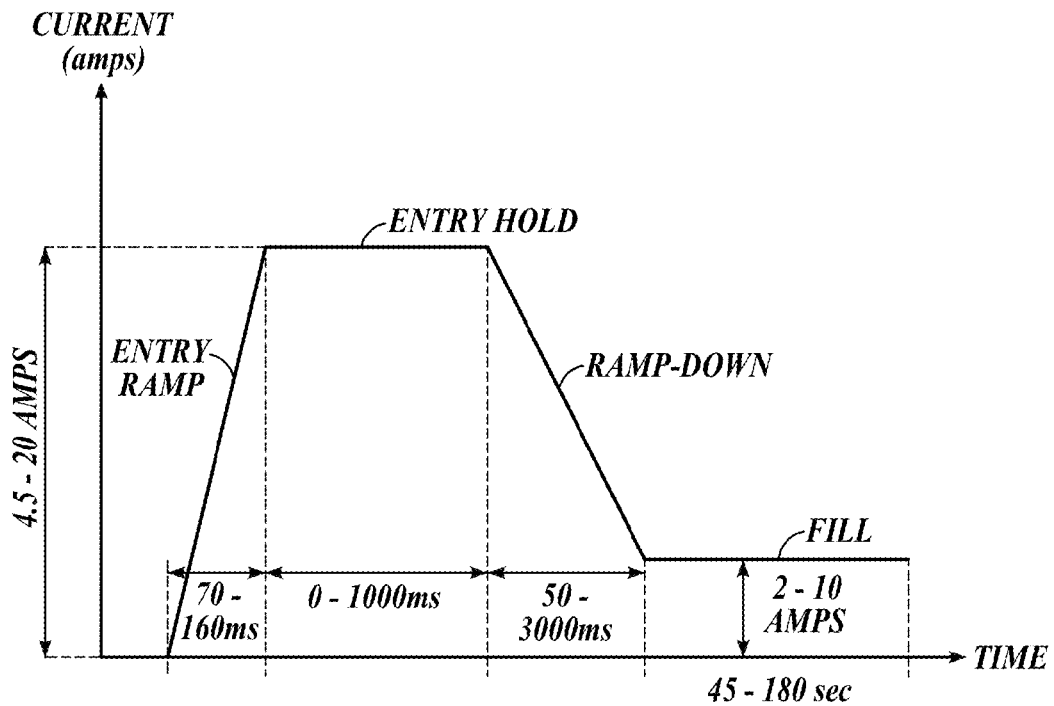
Figure 6:
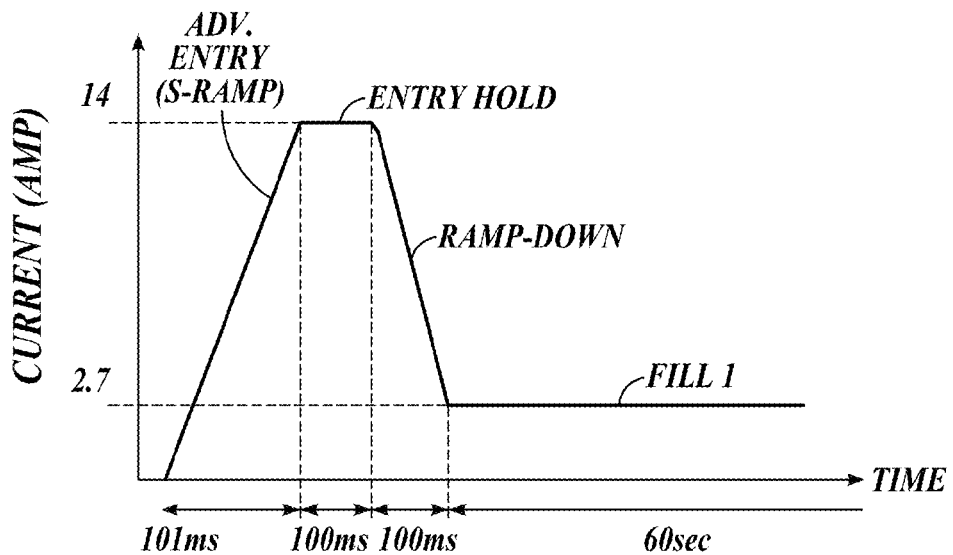

Referring to the non-limiting examples in FIGS. 5 and 6, steady ramping occurs for a period of time, and then is held constant for a period of time. In the non-limiting example of FIG. 5, ramping up is for a period in the range of 70 to 160 ms to a current in the range of 4.5 to 20 amps. Entry hold is maintained at the height of the ramping up current for a period in the range of 0 to 100 ms. In the non-limiting example of FIG. 6, Ramping up is for a period in the range of 101 ms to a current level of 14 amps. Entry hold is maintained at a current level of 14 amps for a period of 100 ms.

The ramping up of current may be selected from the group consisting of linear continuous ramping, non-linear continuous ramping, or pulsed ramping. Although not wishing to be bound by theory, it is believed by the inventors a pulsed waveform can be used to account for the transient effects of current when the pulsing is off. In that regard, it is believed a pulsing a waveform may help control voltage overshoots that affect the chemistry near the wafer.

As non-limiting examples, the ramping up achieves a current level in the range of about 1 amps to about 15 amps or in the range of about 7 amps to about 15 amps. As other non-limiting examples, the ramping up achieves a current level in the range of about 1 amps to about 35 amps or in the range of about 7 amps to about 35 amps. In one embodiment of the present disclosure, the ramping up in current maintains a constant current density. As a larger area of the workpiece is wetted, the current increases but the current density remains constant. In another embodiment of the present disclosure, the ramping up current density may change.

One advantageous effect of the ramping up period is high current nucleation. The ramping up period includes an initial wetting ramp to high current. High current initiation provides good nucleation on the seed layer.

Partial Ramping Down Period

Referring to FIG. 1, a partial ramping down period follows the ramping up period, for example, from current level achieved at point A to the current level at level C for time period B.

Although the ramping down from point A to point B in FIG. 1 is shown to immediately follow the ramping up period, the ramping down period may be after an entry hold period or may immediately follow the ramping up period. Exemplary entry hold periods may be in the range of 0 to 1000 ms. Exemplary current schemes including entry hold periods are shown in FIGS. 5 and 6 and described below in EXAMPLES 4 and 5.

The ramping down of current may be selected from the group consisting of linear continuous ramping, non-linear continuous ramping, or pulsed ramping.

In accordance with one embodiment of the present disclosure, the partial ramping down period is for a period in the range of about 50 ms to about 1 second. In accordance with another embodiment of the present disclosure, the partial ramping down period is for a period in the range of about 50 ms to about 500 ms. In accordance with another embodiment of the present disclosure, the partial ramping down period is for a period in the range of about 50 ms to about 100 ms. In accordance with another embodiment of the present disclosure, the partial ramping down period is for a period in the range of about 50 ms to about 3 seconds. As non-limiting examples, the ramping down period may be 100 ms or 500 ms. The ramping down time depends on the fill time for the features on the workpiece.

As non-limiting examples, the ramping down is from the current level achieved by ramping up to a current level in the range of about 2 amps to about 8 amps.

In the non-limiting example of FIG. 5, ramping down is for a period in the range of 50 to 5000 ms to a fill current level in the range of 2 to 10 amps. In the non-limiting example of FIG. 6, ramping down is for a period of 100 ms from the entry hold current level of 14 amps to a fill current level of 2.7 amps.

Comparing FIGS. 3A (ramping up period) and 3B (ramping down period), the ramping down period has the effect of slowing fill kinetics initiated during the ramping up period to reduce pinch-off. One advantageous effect of ramping down current in accordance with embodiments of present disclosure include lower current gap filling. The ramp down of current helps to control the effective current density during the fill process, as the surface area decreases as a result of feature fill. Therefore, as surface area on the workpiece decreases, lower current to the workpiece maintains an approximately constant current density for the fill period.

Steady State Current Hold

In some embodiments of the present disclosure, fill may continue during the ramping down period of current. In some embodiments of the present disclosure, an optional period of steady state current hold follows the period of partial ramp down of current. Referring to FIG. 1, a steady state current hold period is shown at current level C, which is the lowest current level of the ramping down period, for period of time D.

In one embodiment of the present disclosure, the hold period is for a time period of less than about 0.1 seconds (100 msecs). In one embodiment of the present disclosure, the hold period is for a time period in the range of 0 to about 0.1 seconds (100 msecs). In another embodiment of the present disclosure, the hold period is for a time period in the range of greater than 0 to about 0.1 seconds (100 msecs).

In some embodiments of the present disclosure, fill may begin during the hold period (for example, see FIG. 3C). Although not wishing to be bound by theory, it is believed by the inventors the ramping up and partial ramping down portions of the waveform allow accelerator molecules to travel to the bottom of the features to maintain the effectiveness of additives at the bottom of the feature and prevent pinch-off at the mouth of the feature. In previous processes, a suppressor was used in plating to suppress initial deposition and prevent pinch-off. However, such suppressors were detrimental for gap fill, resulting in voiding.

In some embodiments of the present disclosure, no hold period is included in the waveform (see for example, the waveforms of FIGS. 5 and 6).

First Fill Step

A first fill step can be used to complete gap fill in narrow features after the ramping periods and optional hold period. The current level may be in the range of about 2 amps to about 8 amps and may be different from the hold period. The first period of steady state current may be for a period in the range of about 10 secs to about 240 secs.

In the non-limiting example of FIG. 5, fill is performed for a period in the range of 45 to 180 seconds current level in the range of 2 to 10 amps. In the non-limiting example of FIG. 6, fill is performed for a period of 60 seconds at a fill current level of 2.7 amps.

Second Fill Step

A second optional fill step can be used to complete gap fill in wide features following the first period of steady state current. The second period of steady state current may be for a period in the range of about 0 secs to about 240 secs. The second period of steady state current may be held at a current level in the range of about 4 amps to about 8 amps. The second period of steady state current has a current level greater than the first period of steady state current.

Conventional Overburden Plating

A conventional overburden plating process is used to deposit the capping layer. The current for the capping deposit may have a current level in the range of 15 amps to about 25 amps.

Example 1: Exemplary Four-Way Splits of Waveform

Referring to FIGS. 1 and 2, exemplary four way splits on waveform (WF) using Ethone dilute copper chemistry are provided. Chemistry includes Enthone 5 g/L (80 mM) Cu, 10/L (100 mM) acid, 50 ppm (1.4 mM) Cl, and 9 mL/L acceleration, 4 mL/L suppressor, and 3 mL/L leveler. WF4 is the currently known method. WF21 and WF22 prevent sidewall voiding by promoting higher nucleation density to account for thin seed.

Example 2: TEM Images

Referring to FIGS. 3A-3F, TEM images were obtained for dense 2× structures for partial plated samples. Plating chemistry included 5 g/l (80 mM) Cu, 10 g/l (100 mM) acid, 50 ppm (1.4 mM) Cl, 9 ml/l accelerator, 4 ml/l suppressor, and 3 ml/l leveler. The features were half-filled by the end of the steady state hold period and almost complete fil was achieved within 2 seconds of fill. No pinholes voids were visible at the bottom or middle of the features. Pinch-off was avoided.

Example 3

Figure 4:
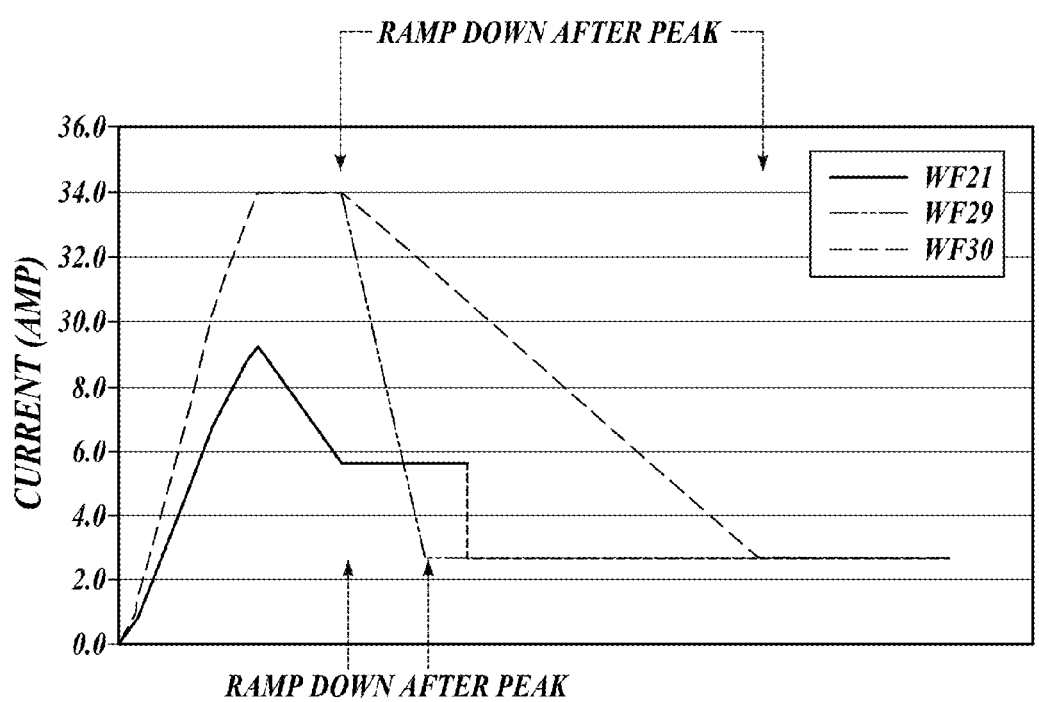
FIGS. 4-6 are plots of other exemplary waveform schemes for electrochemical deposition processes in accordance with embodiments of the present disclosure.

Referring to FIG. 4, exemplary waveforms in accordance with embodiments of the present disclosure for three different wafers are provided: WF21, WF29, and WF30.

For WF21, the wafer does not have a lot of small features. Therefore, the ramp up is to a lower relative current of 8.5 amps compared to WF29 and WF30. The ramp down is immediate without an intermediate hold period, followed by two steady state hold periods.

For WF29 and WF30, the wafer has a lot of small features with thin seed sidewalls. Therefore, the ramp up is to a high current of 34 amps. The hold period is to maintain the plating rate prior to the ramp down. WF29 has a fast slop ramp down in 100 ms for a workpiece with a low pattern density and not a lot of features. WF30 has a slower slope ramp down for a workpiece with a higher pattern density because it takes longer to fill the features.

Example 4

Referring to FIG. 5, an exemplary waveform in accordance with embodiments of the present disclosure is provided. The waveform includes an optional delay upon entry prior to the ramping up. Ramping up is for a period in the range of 70 ms to 160 ms to a current in the range of 4.5 to 20 amps. Entry hold is maintained at the height of the ramping up current for a period in the range of 0 to 100 ms. Ramping down is for a period in the range of 50 ms to 5000 ms to a fill current level in the range of 2 to 10 amps. Fill is performed for a period in the range of 45 to 180 seconds.

FILL 1 may be followed by an optional second fill step, for example, at a greater current than the current of the FILL 1 step, and by a capping step. The second fill and capping steps are not included in the waveform shown in FIG. 5.

Example 5

Referring to FIG. 6, an exemplary waveform in accordance with embodiments of the present disclosure is provided. The waveform includes an optional delay upon entry prior to the ramping up. Ramping up is for a period in the range of 101 ms to a current level of 14 amps. Entry hold is maintained at a current level of 14 amps for a period of 100 ms. Ramping down is for a period of 100 ms from the entry hold current level of 14 amps to a fill current level of 2.7 amps. Fill is performed for a period of 60 seconds.

FILL 1 may be followed by an optional second fill step, for example, the second fill step at a greater current than the current of the FILL 1 step, and by a capping step. The second fill and capping steps are not included in the waveform shown in FIG. 6.

In addition, the FILL 1 step may include more than one ramp down, such as two or more ramp down steps. For example, after entry hold, there may be a ramp down to 4.2 amps and a hold at 4.2 amps for 10 ms, then a ramp down to 2 amps and a hold at 2 amps to complete FILL 1

Example 6: Post-CMP Void Analysis

Figure 7:
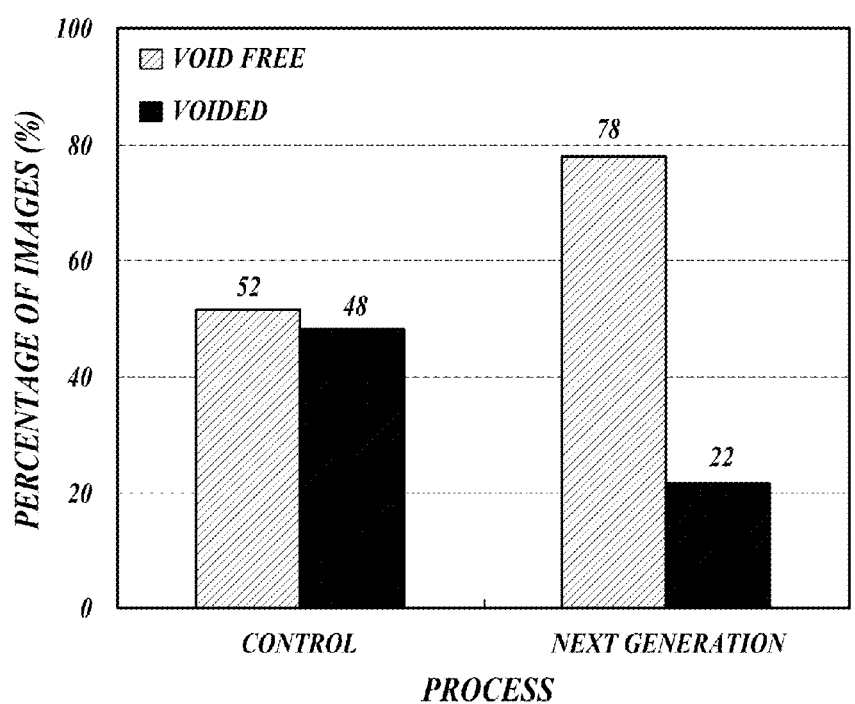
FIG. 7 is a graphical depiction of post-CMP void analysis comparing results in accordance with embodiments of the present disclosure with control results.

Post-CMP defects for Control (high copper concentration at 40 g/L Cu) and Next Generation (low copper concentration at 5 g/L Cu). As seen in the results of FIG. 7, next generation Cu plating provides the lowest void counts.

Example 7: Post-CMP Defects, Yield as a Function of Line Length, EM

Figure 8:
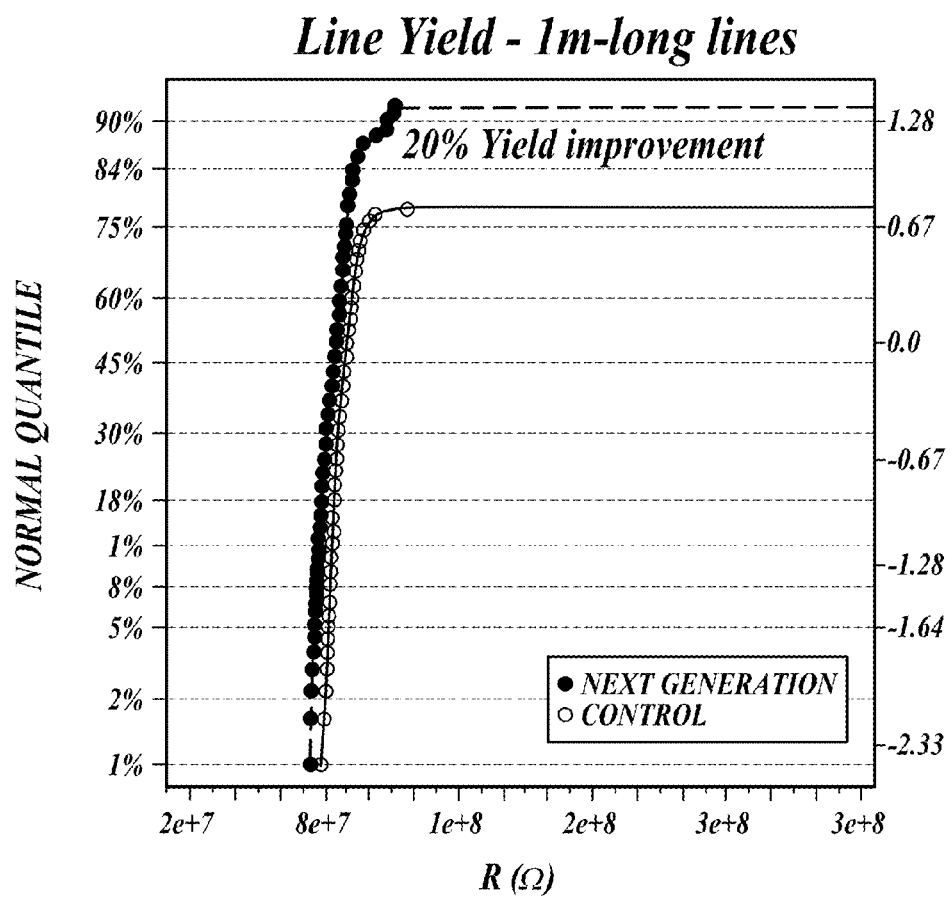
FIGS. 8 and 9 are graphical depictions of post-CMP defects comparing yield as a function of line length (EM) in accordance with embodiments of the present disclosure with control results.
Figure 9:
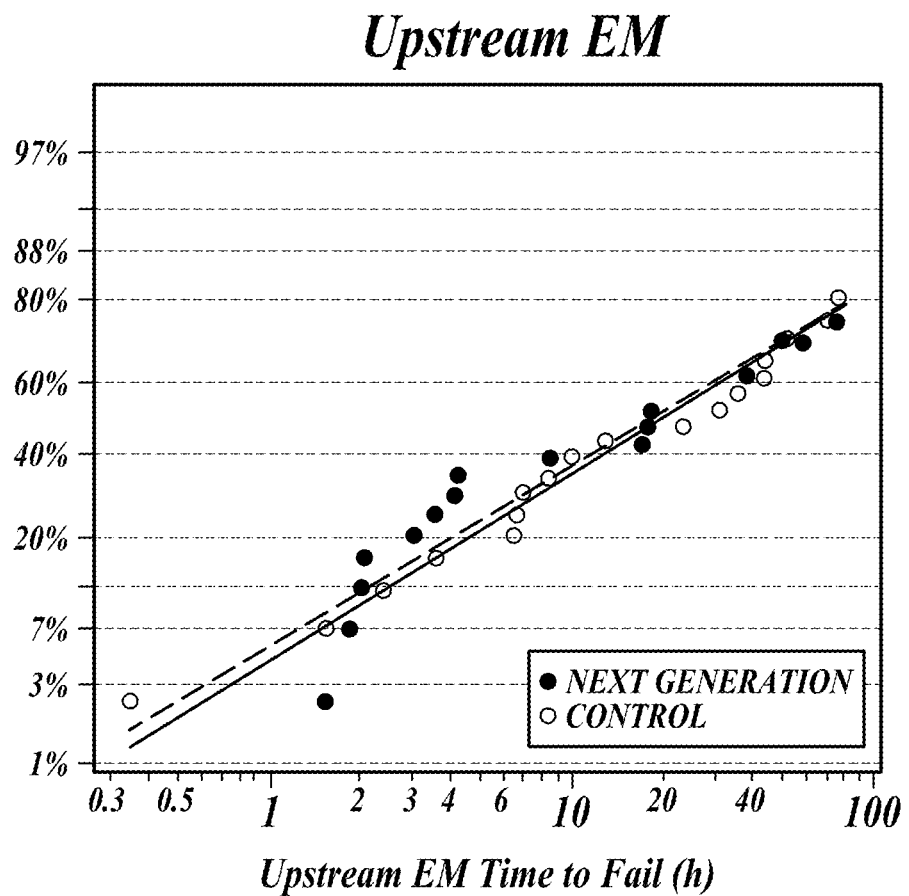

Significant improvement in defect density for Next Generation, approximately 60% drop in void count. Significant improvement in long-lines yield, approximately 20% improvement over control. Equivalent electromigration (EM) to control. See results in FIGS. 8 and 9.

Example 8: Mounding Test

Measure profile over 65 nm, 85 nm, 100 nm, and 120 nm trenches at wafer center, middle, and edge. Mounding with wafers produced in accordance with embodiments of the present disclosure was well below the 2000 Å specification.

Example 9: Exemplary Chemistry Plating Recipe

Plating System: Mustang
Plating chemistry: Low Cu VMS+Enthone chemistry
Chemistry details:
Low Cu VMS: 3.2-15 g/L Cu (50 mM-250 mM), 5-10 g/L acid 30-100 ppm Cl
Enthone Chemistry: 12 ml/L Accelerator, 2 ml/L Suppressor, 2 ml/L Leveler (concentrations can be widely varied based on structure size)
Advanced Entry has tilt angle change from 3.3 to 0 degree while wafer is getting into plating solution.
Entry angel: 2.2°-3.5° (can be varied based on process requirements)
Plating current(Amp): 1.8~20
Plating RPM: 40~160

Example 10: Mounding Test

Referring to TEM images and the graphical representation of the corresponding waveforms. The conventional waveform results in voids in small features, while the improved waveform in accordance with embodiments of the present disclosure results in void free deposition.

Example 11

Figure 11:
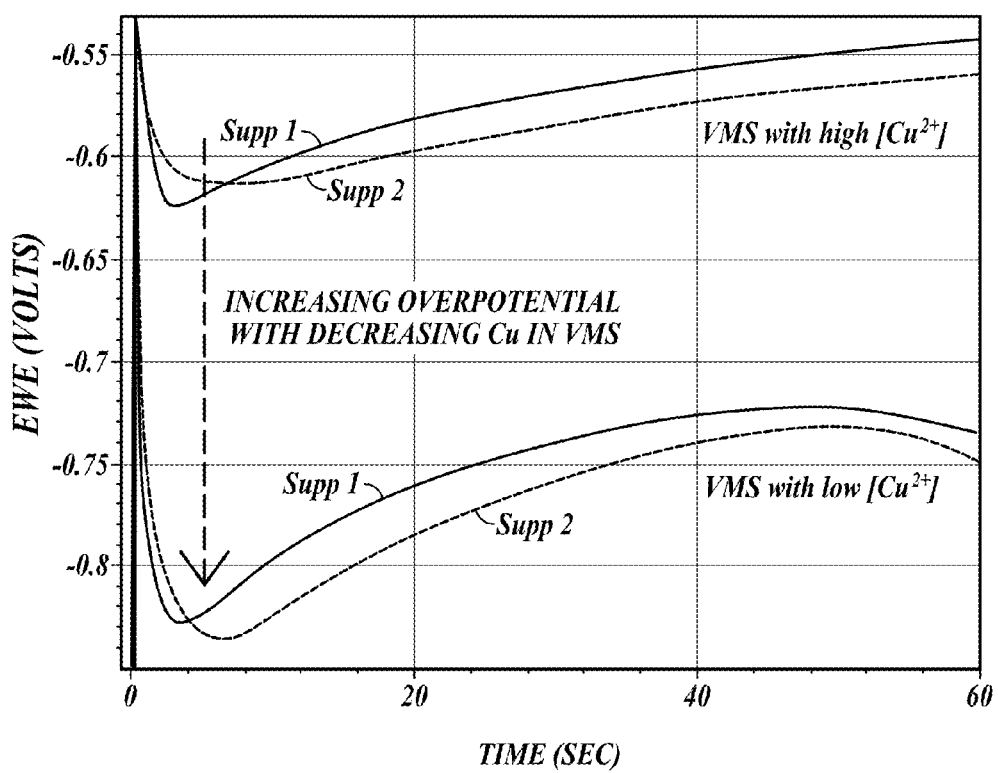
FIG. 11 is a plot of polarization curves during galvanostatic plating at 100 rpm with 2.5 mA/cm2 including electrolytes having Suppressors 1 and 2 and difference copper concentrations.

Referring to the illustrated example in FIG. 11, the rate of polarization of Suppressor 1 (which is both a strong and a fast suppressor in accordance with embodiments of the present disclosure) is 0.83/3 V/s=0.28 V/s. The rate of polarization of Suppressor 2 (which is a strong suppressor as well but is slower than Suppressor 1) is 0.84/6 V/s=0.14 V/s. Therefore, the rate of polarization for Suppressor 1 is twice that of Suppressor 2.

Polarization may be dependent on copper concentration in the electrolyte. For example, for 250 mM of copper in the electrolyte, polarization is at about 0.75 V. For 80 mM of copper in the electrolyte, polarization is greater than 0.80 V.

While illustrative embodiments have been illustrated and described, it will be appreciated that various changes can be made therein without departing from the spirit and scope of the disclosure.

The embodiments of the disclosure in which an exclusive property or privilege is claimed are defined as follows:

1. A method of electroplating on a workpiece having at least one sub-30 nm feature, the method comprising:
   (a) applying a first electrolyte chemistry to the workpiece, the chemistry including a metal cation solute species having a concentration in the range of about 50 mM to about 250 mM and a suppressor resulting in polarization greater than 0.75 V and reaching 0.75 V of polarization at a rate greater than 0.25 V/s; and
   (b) applying an electric waveform, wherein the electric waveform includes a period of ramping up of current immediately followed by an entry hold period of steady state current, immediately followed by a period of partial ramping down of current, wherein the partial ramping down period is for a period of time in the range of about 50 ms to 5000 ms.

2. The method of claim 1, wherein the metal cation is copper.

3. The method of claim 1, wherein either or both of the ramping up of current and the ramping down of current is selected from the group consisting of linear continuous ramping, non-linear continuous ramping, or pulsed ramping.

4. The method of claim 1, wherein the ramping up period is in the range of about 50 ms to about 200 ms.

5. The method of claim 1, wherein the ramping up period begins either immediately upon entry or after an initial delay.

6. The method of claim 1, wherein the ramping up achieves a current level selected from the group consisting of in the range of about 1 amps to about 15 amps and in the range of about 7 amps to about 15 amps.

7. The method of claim 1, wherein the ramping down is from the current level achieved by ramping up to a current level in the range of about 2 amps to about 8 amps.

8. The method of claim 1, wherein the entry hold period is for a time period in the range of about 0 to about 200 ms.

9. The method of claim 1, further comprising a ramp down hold period of steady state current immediately following the period of partial ramp down of current and at the current level of the completion of the partial ramp down.

10. The method of claim 9, wherein the ramp down hold period of steady state current is for a period in the range selected from the group consisting of about 0 secs to about 1.0 sec and about greater than 0 secs to about 1.0 sec.

11. The method of claim 9, wherein the ramp down hold period of steady state current is held at a current level in the range of about 2 amps to about 8 amps.

12. The method of claim 9, further comprising a first period of steady state current following the hold period of steady state current to fill one or more features on the workpiece.

13. The method of claim 12, wherein the first period of steady state current is for a period in the range of about 10 secs to about 240 secs.

14. The method of claim 12, wherein the first period of steady state current is held at a current level in the range of about 2 amps to about 8 amps.

15. The method of claim 12, further comprising a second period of steady state current following the first period of steady state current to fill one or more features on the workpiece.

16. The method of claim 15, wherein the second period of steady state current is for a period in the range of about 0 secs to about 240 secs.

17. The method of claim 15, wherein the second period of steady state current is held at a current level in the range of about 4 amps to about 8 amps.

18. The method of claim 15, wherein the second period of steady state current has a current level greater than the first period of steady state current.

19. The method of claim 12, further comprising a capping step for the workpiece.

20. The method of claim 19, wherein the current for the capping step has a current level in the range of 15 amps to about 25 amps.

21. The method of claim 1, wherein the workpiece is rotated during entry at a speed in the range of about 35 to about 175 rpms.

* * * * *